United States Patent
Li et al.

(10) Patent No.: US 7,517,784 B2
(45) Date of Patent: Apr. 14, 2009

(54) METHOD FOR PRODUCING HIGH CARRIER CONCENTRATION P-TYPE TRANSPARENT CONDUCTING OXIDES

(75) Inventors: Xiaonan Li, Evergreen, CO (US); Yanfa Yan, Littleton, CO (US); Timothy J. Coutts, Golden, CO (US); Timothy A. Gessert, Conifer, CO (US); Clay M. Dehart, Westminster, CO (US)

(73) Assignee: Alliance For Sustainable Energy, LLC, Golden, CO (US)

( * ) Notice: Subject to any disclaimer, the term of this patent is extended or adjusted under 35 U.S.C. 154(b) by 620 days.

(21) Appl. No.: 10/553,245

(22) PCT Filed: Apr. 2, 2002

(86) PCT No.: PCT/US02/11104

§ 371 (c)(1),
(2), (4) Date: Oct. 17, 2005

(87) PCT Pub. No.: WO03/017333

PCT Pub. Date: Feb. 27, 2003

(65) Prior Publication Data

US 2008/0118777 A1     May 22, 2008

Related U.S. Application Data

(63) Continuation-in-part of application No. PCT/US01/25874, filed on Aug. 17, 2001.

(51) Int. Cl.
    *H01L 21/44*     (2006.01)
(52) U.S. Cl. ................ 438/609; 428/702; 257/E21.006
(58) Field of Classification Search ................. 438/608, 438/609; 428/702
See application file for complete search history.

(56) References Cited

U.S. PATENT DOCUMENTS

| | | | |
|---|---|---|---|
| 4,612,411 A | 9/1986 | Wieting | 136/265 |
| 4,638,111 A * | 1/1987 | Gay | 136/249 |
| 5,078,803 A | 1/1992 | Pier et al. | 136/256 |
| 5,324,365 A | 6/1994 | Niwa | 136/256 |
| 5,420,043 A | 5/1995 | Niwa | 438/96 |
| 5,458,753 A | 10/1995 | Sato et al. | 204/192.29 |
| 5,578,501 A | 11/1996 | Niwa | 438/96 |
| 5,604,133 A | 2/1997 | Aoike | 438/96 |
| 5,612,229 A | 3/1997 | Yoshida | 438/72 |

(Continued)

OTHER PUBLICATIONS

M. Joseph et al., "p-type Electrical Conduction in ZnO Thin films by Ga and N Codoping," Jpn. J. Appl. Phys. 38, (1999) pp. L1205-1207.

(Continued)

*Primary Examiner*—W. David Coleman
(74) *Attorney, Agent, or Firm*—Paul J. White; Mark D. Trenner; John C. Stolpa (57) ABSTRACT

A method for producing transparent p-type conducting oxide films without co-doping plasma enhancement or high temperature comprising: a) introducing a dialkyl metal at ambient temperature and a saturated pressure in a carrier gas into a low pressure deposition chamber, and b) introducing NO alone or with an oxidizer into the chamber under an environment sufficient to produce a metal-rich condition to enable NO decomposition and atomic nitrogen incorporation into the formed transparent metal conducting oxide.

19 Claims, 11 Drawing Sheets

U.S. PATENT DOCUMENTS

| | | | |
|---|---|---|---|
| 5,620,924 A | 4/1997 | Takizawa | 427/108 |
| 5,716,480 A | 2/1998 | Matsuyama et al. | 136/249 |
| 5,756,207 A | 5/1998 | Clough et al. | |
| 5,804,466 A | 9/1998 | Arao et al. | 438/95 |
| 5,913,986 A | 6/1999 | Matsuyama | 136/255 |
| 5,990,416 A | 11/1999 | Windisch et al. | 136/255 |
| 6,040,521 A | 3/2000 | Kushiya et al. | 136/265 |
| 6,043,427 A | 3/2000 | Nishimoto | 136/258 |
| 6,107,116 A | 8/2000 | Kariya et al. | 438/87 |
| 6,187,150 B1 | 2/2001 | Yoshimi et al. | 204/192.29 |
| 6,238,808 B1 | 5/2001 | Arao et al. | 428/629 |
| 6,424,687 B1 | 6/2001 | Schropp | 136/255 |

OTHER PUBLICATIONS

K. Minegishi et al., "Growth of p-type Zinc oxide Films by Chemical Vapor Deposition," Jpn. J. Appl. Phys. 36, (1997) pp. L1453-L145.

X. Gao et al., "Pulsed Reactive Laser Deposition of p-type ZnO Film Enhanced by an Electron Cyclotron Resonance Source.," J. of Crystal Growth, 223 (2001) 135-139.

S. B. Zhang et al. J. Appl. Phys. 83, 3192 (1998).

Y. Sato et al., Thin Solid Films 281-282, 445 (1996).

Yan et al. in "Control of Doping by impurity Chemical Potentials: Predictions for p-Type ZnO," Physical Review Letters 86, 5723 (2001).

* cited by examiner

METHOD FOR PRODUCING HIGH CARRIER CONCENTRATION P-TYPE TRANSPARENT CONDUCTING OXIDES

This application is a continuation-in-part of PCT/US01/25874 filed Aug. 17, 2001.

CONTRACTUAL ORIGIN OF THE INVENTION

The United States Government has rights in this invention pursuant to Contract No. DE-AC36-99GO10337 between the United States Department of Energy and the Midwest Research Institute.

TECHNICAL FIELD

The invention relates to a method for producing p-Type transparent conducting oxide films with NO gas and a method for making high quality p-Type transport conducting oxides.

BACKGROUND ART

Zinc oxide (ZnO), like other transparent conducting oxides (TCOs) are important materials for-next generation optoelectronic devices such as low cost, optically transparent, and wavelength tunable LEDs, and large area flat-panel displays, and solar cells. Recently, significant efforts have been made directed to producing p-Type ZnO. M. Joseph et al., "p-Type Electrical Conduction in ZnO Thin films by Ga and N Codoping," Jpn. J. Appl. Phys. 38, (1999) pp. L1205-1207; K. Minegishi et al., "Growth of p-Type Zinc oxide Films by Chemical Vapor Deposition," Jpn. J. Appl. Phys. 36, (1997) pp. L1453-L1455; X. Gao et al., "Pulsed Laser Reactive Laser Deposition of p-Type ZnO Film Enhanced by an Electron Cyclotron Resonance Source.," J. of Crystal Growth, 223 (2001) 135-139.

However, due to asymmetric doping limitations, ZnO remains difficult to dope p-Type. S. B. Zhang et al. J. Appl. Phys. 83, 3192 (1998). These difficulties result from low solubility of appropriate dopants, inability to form shallow acceptor levels, and dopant-induced self-compensation. Y. Sato et al., Thin Solid Films 281-282, 445 (1996).

Recently, reports have emerged indicating some success with N doping of ZnO from $N_2O$ or $NH_3$ gas. Minegishi et al. reports using excess Zn in a CVD system to assist introduction N via $NH_3$ into ZnO films. Following deposition, N doping is enabled by a high-temperature activation step which results in a reported hole concentration of $1.5 \times 10^{16}$ $cm^{-3}$ and mobility of $-12$ $cm^2V^{-1}s^{-1}$. Joseph et al. reports using electron cyclotron resonance to assist in nitrogen doping via $N_2$ or $N_2O$, and also using co-doping techniques to increase the solubility of nitrogen in the ZnO film. This work report a relatively high hole concentration of $4 \times 10^{19}$ $cm^{-3}$ but at a very low mobility of $0.07$ $cm^2V^{-1}S^{-1}$.

Yan et al. in "Control of Doping by impurity Chemical Potentials: Predictions for p-Type ZnO," Physical Review Letters 86, 5723 (2001) have proposed a model predicting that NO gas should be a better N dopant source than $N_2O$ and $N_2$. This theoretical model indicates that the defect formation energy of N on an oxygen site ($N_O$) from NO should be lower than that from $N_2O$. Moreover, if deposition conditions that yield zinc-rich growth stoichiometries are used, the defect formation energy should be negative. Therefore, processes that produce these thermodynamically favorable conditions should allow N doping in ZnO from NO without the requirement of added energy (e.g., high-temperature or plasma) to break the NO bond. This process should also produce a higher solubility of nitrogen in ZnO, compared to using $N_2O$, or $N_2$.

U.S. Pat. No. 5,578,501 entitled "Method of Manufacturing a Solar Cell by Formation of a Zinc Oxide Transparent Conductive Layer," Niwa; U.S. Pat. No. 5,420,043 entitled "Method of Manufacturing a Solar Cell," Niwa; and U.S. Pat. No. 5,324,365 entitled "Solar Cell," Niwa, each disclose methods for manufacturing solar cells in which a ZnO transparent conducting layer is used as electrodes. The ZnO layer used in these three patents are not made to be p-Type conductors.

A method for continuously depositing transparent oxide material (including ZnO) by chemical pyrolysis is disclosed in U.S. Pat. No. 5,180,686 entitled "Method for Continuously depositing a Transparent Oxide Material by Chemical Pyrolysis," Banerjee, et al. This patent only disclose a method for making regular ZnO films for solar cell use, in which the ZnO is an n-Type conductor.

U.S. Pat. No. 5,612,229 entitled "Method of Producing Photovoltaic Device," Yoshida, discloses a method for manufacturing solar cells in which a ZnO transparent conductor layer is used as electrodes. This patent does not disclose how to make p-Type ZnO and other metal oxide films.

U.S. Pat. No. 5,804,466 entitled "Process for Production of Zinc Oxide Thin Film, and Process for Production of Semiconductor Device Substrate and Process for Production of Photoelectric Conversion Device Using the Same Film," Arao, et al., and U.S. Pat. No. 6,238,808 entitled "Substrate with Zinc Oxide Layer, Method for Producing Zinc Oxide Layer, Photovoltaic Device, and Method for Producing Photovoltaic Device," Arao, et al., disclose methods of producing high quality ZnO films for use in solar cells. These patents do not disclose any method for making p-Type ZnO films.

Methods for manufacturing solar cells is disclosed in U.S. Pat. No. 5,716,480 entitled "Photovoltaic Device and Method of Manufacturing the Same," Matsuyama, et al., and U.S. Pat. No. 5,913,986 entitled "Photovoltaic Element Having a Specific Doped Layer," Matsuyama; however, these patents do not disclose methods for making p-Type ZnO films.

U.S. Pat. No. 5,458,753 entitled "Transparent Conductive Film Consisting of Zinc Oxide and Gallium," Sata, et al., disclose better quality ZnO films containing Ga. The ZnO films are n-Type materials.

A method of producing n-Type ZnO film used as window layers in solar cells is disclosed in U.S. Pat. No. 6,040,521 entitled N-Type Window Layer for a Thin Film Solar Cell and Method of Making," Kushiya, et al.

U.S. Pat. No. 5,990,416 entitled "Conductive Metal Oxide Film and Method of Making," Windisch, Jr., et al., discloses a method to reduce a dopant in metal oxide films. The dopant is a metal element. This patent does not disclose any method for making p-Type ZnO films.

U.S. Pat. No. 5,078,803 entitled Solar Cells Incorporating Transparent Electrodes Comprising Hazy Zinc Oxide," Pier, et al., discloses a method for manufacturing solar cells incorporating transparent electrodes comprising hazy ZnO. This patent does not disclose any method for making p-Type ZnO films.

A method for manufacturing a thin film photovoltaic device comprising a transparent conductive film, which may be ZnO is disclosed in U.S. Pat. No. 6,187,150 B1 entitled "Method for Manufacturing Thin Film Photovoltaic Device," Yoshimi, et al. This patent does not disclose any method for making p-Type ZnO films.

U.S. Pat. No. 5,620,924 entitled "Method of Preventing Deterioration of Film Quality of Transparent Conductive Film," Takizawa, et al., discloses a method of preventing deterioration of film quality of transparent conductive film, which may be ZnO. This patent does not disclose any method for making p-Type ZnO films.

A process for producing a thin film solar cell is disclosed in U.S. Pat. No. 6,242,687 B 1 entitled "Amorphous Silicon Photovoltaic Devices and Method of Making Same," Schropp, et al. This patent does not disclose any method for making p-Type ZnO films.

U.S. Pat. No. 6,107,116 entitled "Method for Producing a Photovoltaic Element with zno layer having Increasing Fluorine Content in Layer Thickness Direction," Kariya, et al., discloses a method for producing a photovoltaic element with ZnO as a layer having increasing F content in the layer thickness direction. This patent does not disclose a method for making p-Type ZnO films.

A method for manufacturing photovoltaic devices is disclosed in U.S. Pat. No. 6,043,427 entitled "Photovoltaic Device, Photoelectric Transducer and Method of Manufacturing Same," Nishimoto. The method does not disclose making p-Type ZnO films.

A method for manufacturing photovoltaic devices comprising ZnO films is disclosed in U.S. Pat. No. 5,604,133 entitled "method of Making Photovoltaic Device," Aoike. This patent does not disclose making p-Type ZnO films.

U.S. Pat. No. 4,612,411 entitled Thin Film Solar Cell with ZnO Window Layer," Wieting, et al., discloses a method for producing thin film solar cells with ZnO window layers. This patent does not disclose methods for making p-Type ZnO films.

There is a need in the art of preparing transparent conducting oxides, and particularly ZnO, to reach the carrier concentration criteria for making LEDs.

DISCLOSURE OF INVENTION

One advantage of the present invention is to provide a method of utilizing chemical vapor deposition (CVD) to provide p-Type ZnO films.

Another advantage of the present invention is to provide a chemical vapor deposition method for making p-Type ZnO films utilizing ultra-high-purity diethylzinc (DEZ) and NO gas carried by nitrogen or argon to produce p-Type ZnO films with a high carrier concentration and mobility of 0.751 $cm^2V^{-1}s^{-1}$, which are the criteria for making LEDs.

A further advantage of the present invention is to utilize a chemical vapor deposition method to produce p-Type ZnO films by determining growth conditions of DEZ and NO flow rates, chamber pressure, carrier gas, substrate temperature, and film thickness that are critical for achieving p-Type ZnO films.

BEST MODE FOR CARRYING OUT THE INVENTION

The experiments were performed using a low-pressure CVD system, in which the reaction chamber is a cold-wall, rectangular quartz tube containing a high-purity graphite susceptor that is heated by a five-zone bank of infrared lamps. The deposition temperature was controlled between 200° C. to 550° C. and measured by thermocouples located on the bottom of the graphite susceptor. Corning 1737 glass substrates (102-mm×102-mm) were arranged horizontally on the graphite susceptor. Ultrahigh-purity diethylzinc (DEZ) was used as the Zn source. The DEZ temperature was maintained at laboratory ambient temperature (23° C.±2° C.), producing a saturated pressure of ~11 torr.

The amount of DEZ flowing to the low-pressure deposition chamber was controlled through a throttle-valve/pressure-feedback circuit, using $N_2$ or Ar as the carrier gas. A second throttle valve and mechanical pump were used to control the chamber pressure at 30 torr. $O_2$ and NO (diluted to 2 vol. % in Ar) were used as the oxidizer and doping source. The DEZ and oxidizer gases were introduced into the deposition chamber through gas injectors located on the top and bottom of the reaction chamber's end cap flange, and then allowed to mix inside the chamber. The total gas flow through the chamber during the deposition was between 2000-3000 sccm.

Films were produced with thicknesses of 0.3 to 1.0 μm, measured using a stylus profilometer (DekTak 3). The composition of the films were analyzed by Auger Electron Spectroscopy (AES). The crystal properties were assessed using X-ray diffraction (XRD, Sintag Model PTS). The electrical properties were measured using Hall Analysis (van der Pauw technique, BioRad Model HL5500). The conduction type was confirmed by Seebeeck coefficient measurements. A Cary 5G spectrophotometer with an integrating sphere detector and a helium-neon light was used to measure the total (specula plus diffuse) transmittance (T) and reflectance (R) spectrum in the wavelength range of 250-2000 nm.

In general, the metalorganic chemical vapor deposition (MOCVD) growth conditions are as follows:

| | |
|---|---|
| MOCVD Precursors: | Diethylzinc [DEZ: $(C_2H_5)_2Zn$] |
| | Ultra-High purity oxygen gas |
| | 1% or 2% NO dilute in Ar or $N_2$ gas |
| Deposition temperatures: | 200° C.-550° C. |
| Reactor chamber pressure: | 5-80 Torr |
| Oxygen flow rate: | 0-100 sccm |
| NO flow rate: | 2-40 sccm |
| DEZ flow rate: | 0.1-1 sccm |

Compositional Analysis

Undoped ZnO films were produced in the temperature range of 200° C. to 550° C. by CVD reaction of DEZ and $O_2$ gas. ZnO films are insulating if deposited at low temperature, and lightly n-Type (carrier concentration $\sim 10^{18}$ cm$^{-3}$) when deposited at higher temperature. The mobility of these films increases systematically with increasing substrate temperature from $\sim 1$ cm$^2$V$^{-1}$S$^{-1}$ (at $\sim 200°$ C.) to $\sim 10$ cm$^2$V$^{-1}$s$^{-1}$ (at 500° C.). Adding NO gas to this standard CVD ZnO deposition procedure does not change the electrical properties of the film significantly. As may be seen from FIG. 3, there is no significant changes on carrier concentration (C.C.) or mobility (μ) due to NO doping, that is, all ZnO films remain n-Type. For these DEZ+O$_2$+NO films, Auger electron spectroscopy (AES) was unable to detect any N (detection limit of AES is $\sim 0.5$ at. %).

Figure 4:
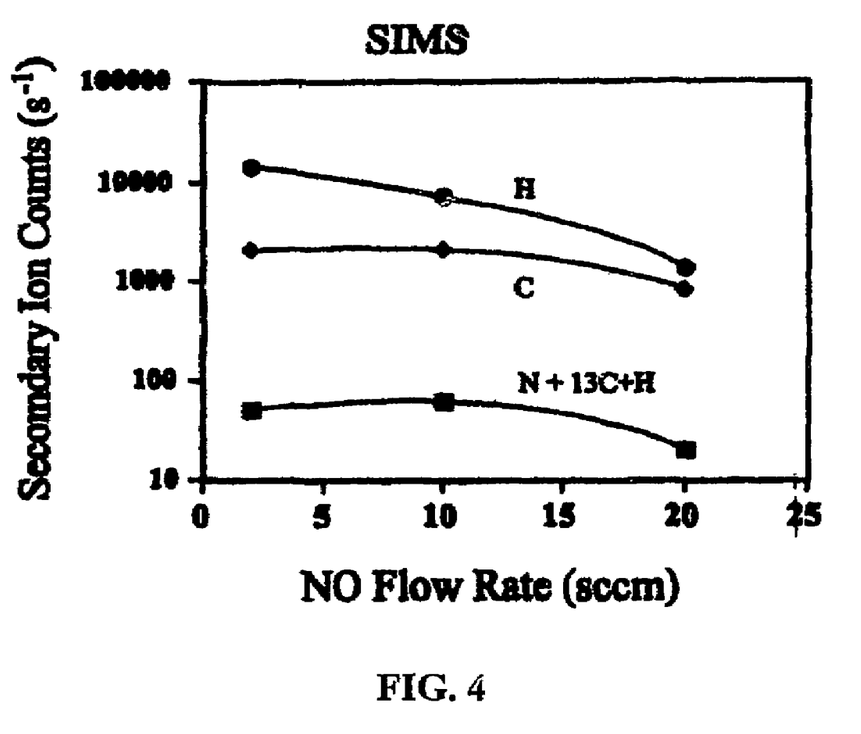
FIG. 4 is a graph depicting secondary ion counts ($S^{-1}$) versus NO flow rate (sccm) where SIMS indicates a possible very low level of nitrogen in the ZnO film.

From FIG. 4, secondary ion mass spectrometry (SIMS) shows that there is possible nitrogen in the ZnO film but the concentration decreases with NO flow, and the detection limit of SIMS is <0.0001 at. %.

Figure 3:
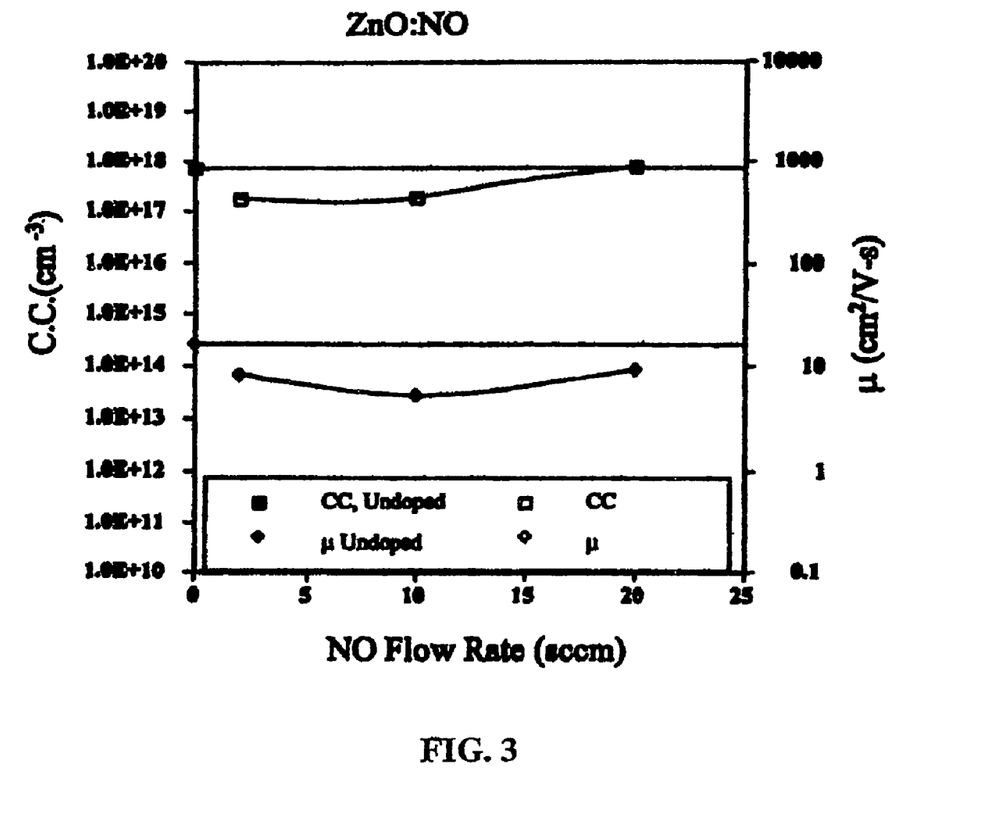
FIG. 3 is a graph depicting electrical properties versus NO flow rate (sccm) in which the ZnO films remain of the n-Type.

In both FIGS. 3 and 4, the following conditions applied: $F_{NO}$ is changed; $F_{O2}$=100 sccm; $F_{DEZ}$=1 sccm; and $T_d$=550° C.

Figure 5:
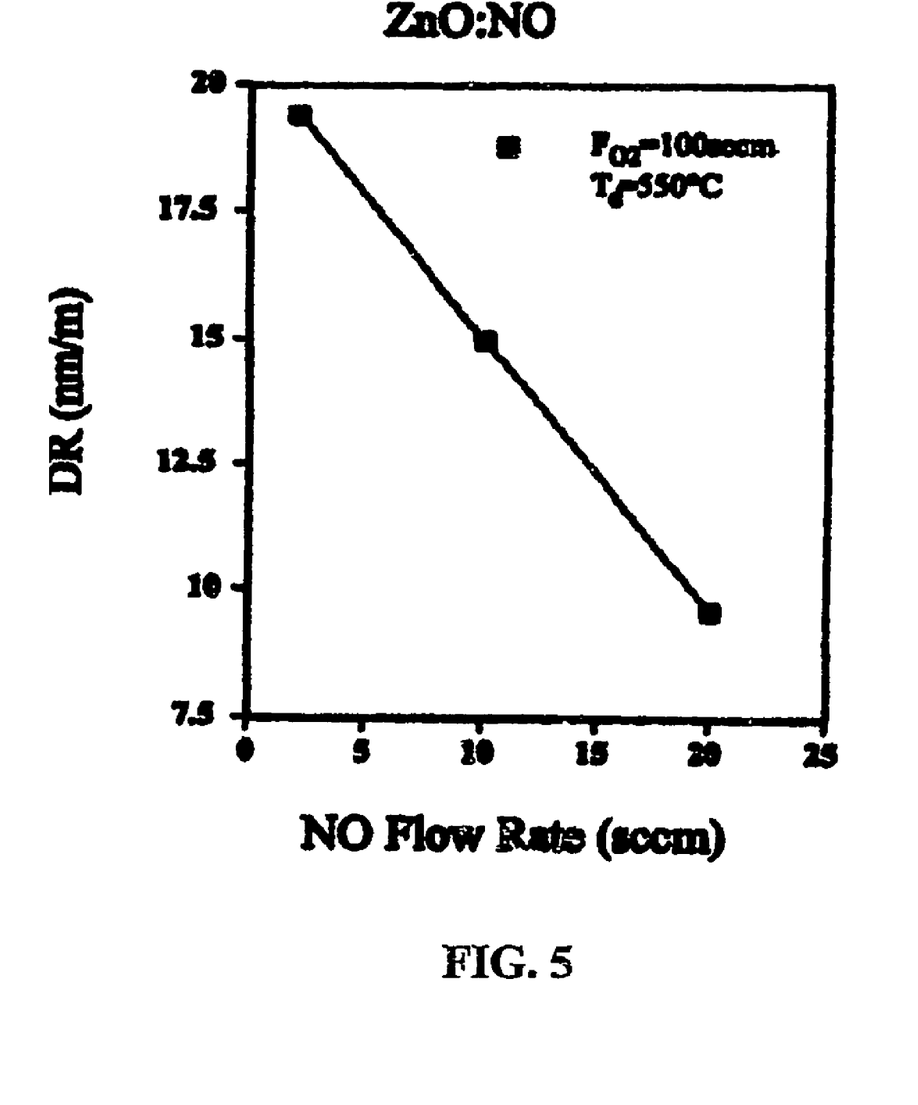
FIG. 5 is a graph showing deposition rates (DR) versus NO flow rate (sccm) for ZnO:NO films.

From FIG. 5, it can be seen that the film deposition rates (DR) decreases as the NO flow rate increases. The diethlyzinc (DEZ) reacts with oxygen as follows:

$$(C_2H_5)_2Zn + 5O_2 = ZnO + 5H_2O + 4CO \quad 1)$$

Adding NO gas to the reaction
2)

Adding NO gas consumes more O$_2$ and generates HNO$_3$, both of which will decrease the deposition rate of ZnO. Again, the conditions giving rise to FIG. 5 are: $F_{NO}$ is changed; $F_{O2}$=100 sccm; $F_{DEZ}$=1 sccm; and $T_d$=550° C. As the NO flow increases (with the O$_2$ flow constant), the film deposition rate decreases.

It is believed that the decrease in the film deposition rate is due to one of the following:
1) decreasing quantity of reactant species; and
2) partially removing deposited film by interaction with chemicals that are being formed in the gas phase (i.e., chemical etching).

Both contingencies suggest a reaction between DEZ and/or O$_2$ with the NO gas.

Figure 8:
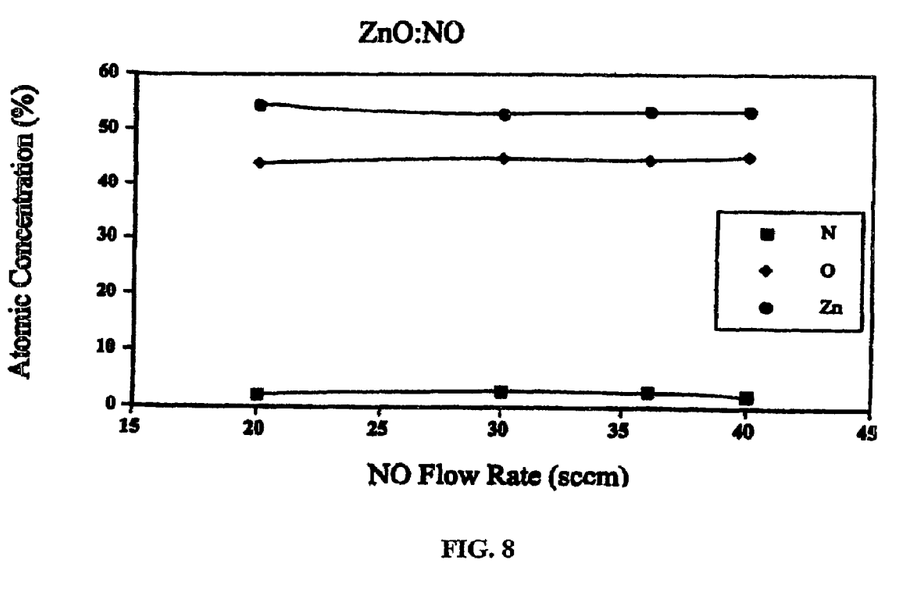
FIG. 8 is a graph depicting atomic concentration (%) versus NO flow rate, wherein nitrogen has been detected in the ZnO film by AES.

To investigate the effect that O$_2$ may have in the DEZ+O$_2$+NO gas-phase chemistry, we eliminated the O$_2$ completely. In this new source mixture (DEZ+NO), the NO must supply both the oxidizer (O) and the N dopant. This experiment not only indicated if O$_2$ is a significant component of the gas-phase dynamics, it also explored the more fundamental suggestion that NO readily decomposes in the CVD reaction chamber. XRD and AES analysis of these DEZ+NO films indicated that, not only is O liberated allowing ZnO to form, but that N is incorporated into ZnO films at a much higher level than for films produced with DEZ+O$_2$+NO chemistry (i.e., 2-3 at. % N in ZnO measured). Nitrogen has been detected in the ZnO film by AES, as shown in FIG. 8 where the conditions are: $F_{NO}$ is varied; $F_{DEZ}$= 1 sccm; and $T_d$=400° C. The nitrogen concentration is about 2% for this group of samples compared with an undetectable amount for FIG. 4.

Figure 9:
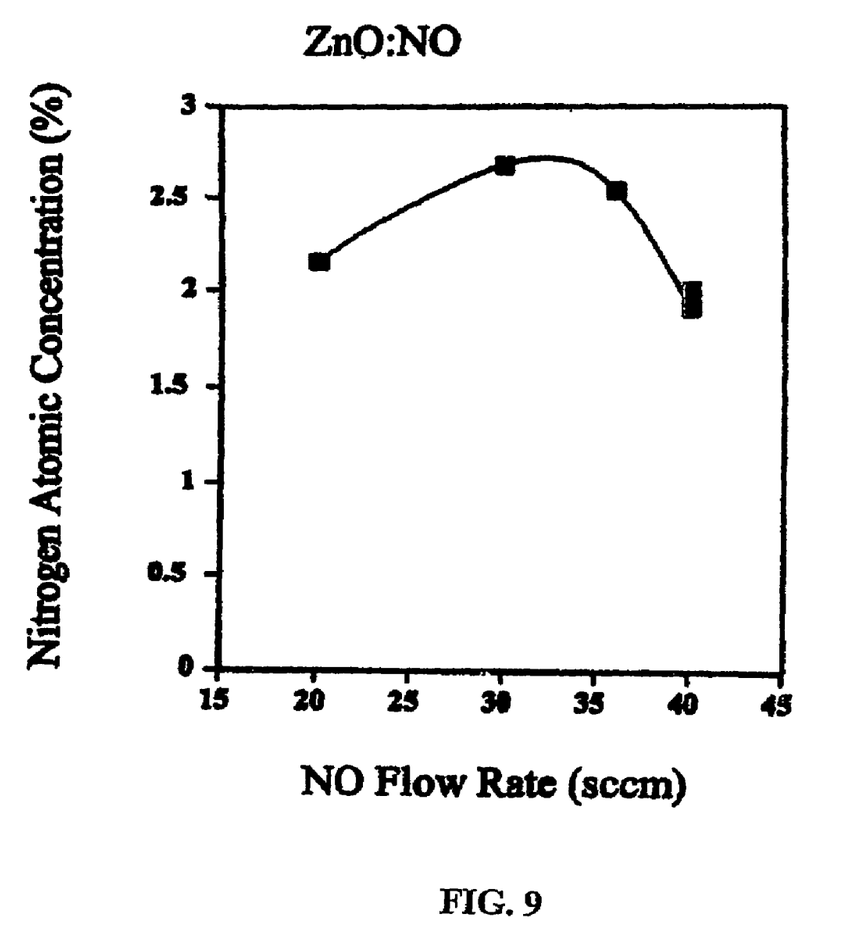
FIG. 9 is a graph depicting nitrogen atomic concentration (%) versus NO flow rate (sccm).
Figure 10:
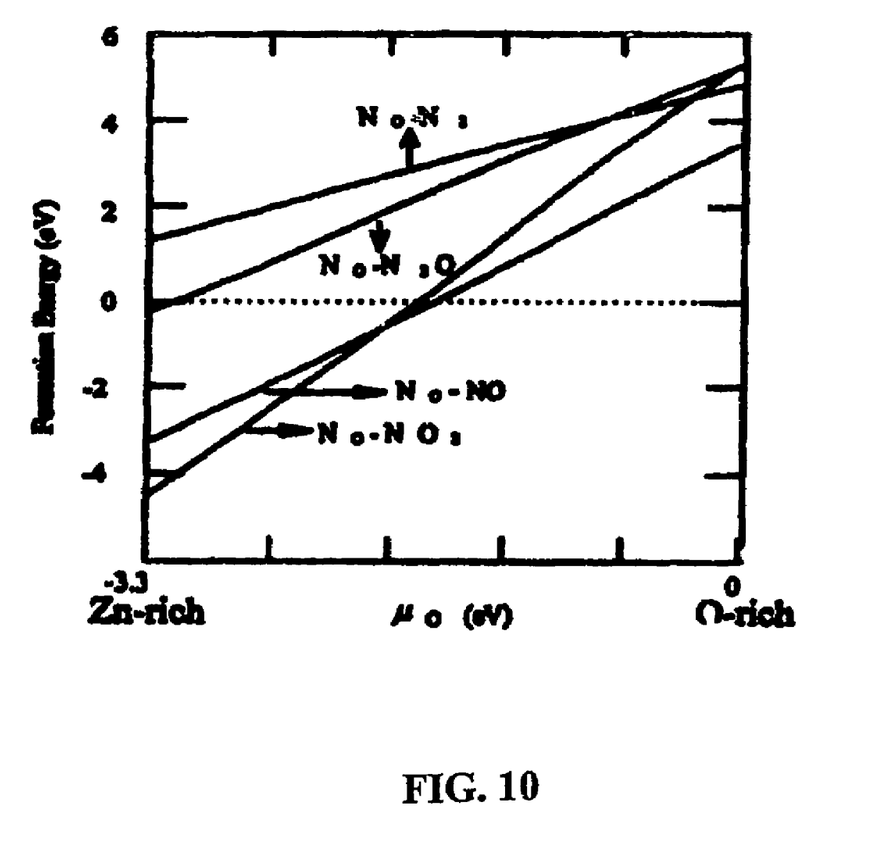
FIG. 10 is a graph which shows the formation of energy needed to put nitrogen (on oxygen site) into ZnO film.
Figure 11:
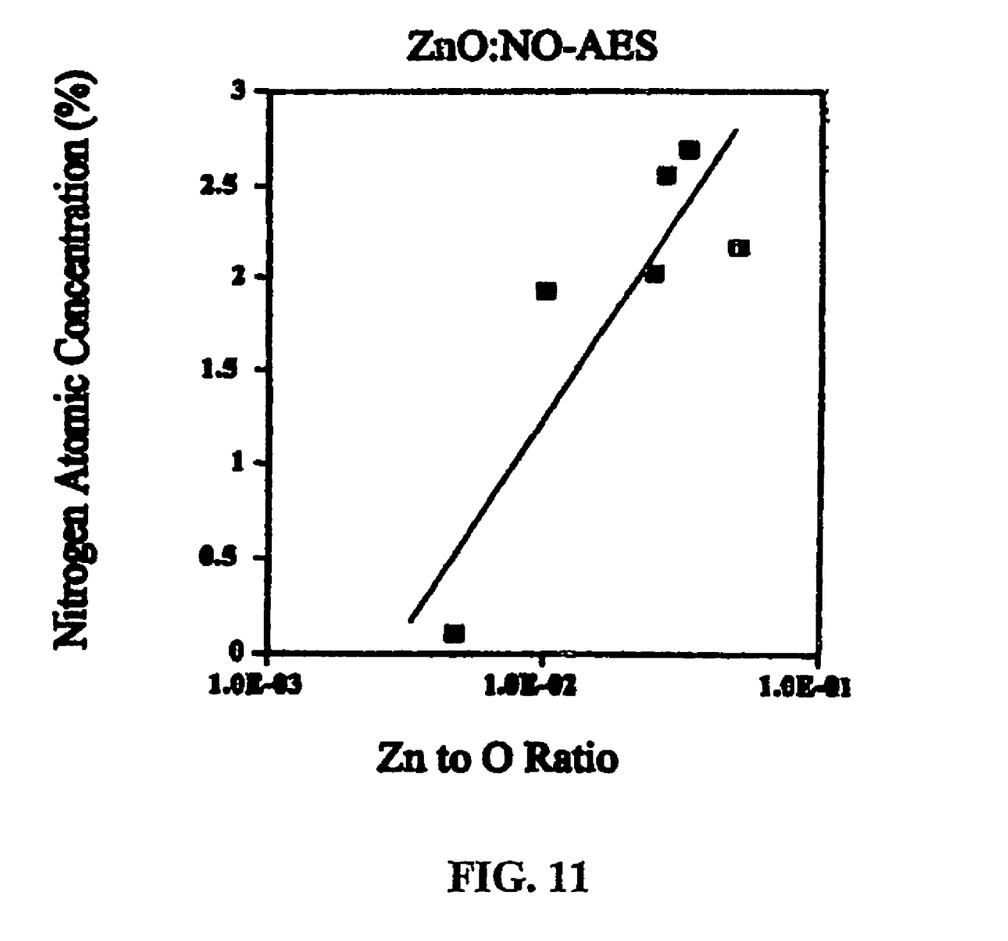
FIG. 11 is a graph depicting the nitrogen atomic concentration (%) versus Zn to O ratio.

In FIG. 9 where the conditions are the same as those in FIG. 8, the nitrogen concentration in the ZnO films is not simply increased with the NO flow rate. It first increases and then decreases. This shows that there are at least two competing mechanisms that contribute to nitrogen concentration in the ZnO film. One of the mechanisms appears to increase the nitrogen concentration and the other appears to decrease nitrogen concentration in the ZnO film. When the NO concentration in the reaction chamber is increased further, a small amount of O$_2$ is again added to the NO+DEZ reactant sources, the N concentration measured in the film decreased slightly. These results show that the concentration of N in the ZnO films is not only dependent on the NO concentration in the chamber but also depend critically on any residual O in the chamber. This relationship is understood if one considers the Zn-to-O ratio. When O$_2$ concentration in the chamber is high (i.e., the Zn-to-O ratio is low), there is no detectable N in the ZnO films. As the O$_2$ gas concentration decreases (i.e. the Zn-to-O ratio increases), N concentration in the ZnO films increases. Similarly, if DEZ concentration remains constant while NO concentration increases, the Zn-to-O ratio again decreases, and the N concentration in the ZnO films decrease. These observations are consistent with the model suggested in PCT/US01/25874 entitled "High Carrier Concentration p-Type Transparent Conducting Oxide Films," Yan et al., since higher Zn-to-O ratios will tend to produce Zn-rich films as shown in FIGS. 10 and 11. In FIG. 10. the formation energy to put nitrogen (on the oxygen site) into ZnO film is lower for the Zn-rich growth conditions. Therefore, the solubility of nitrogen in ZnO film increases as the O$_2$ level decreases.

The experimental data as shown in FIG. 11 shows that the N concentration increases with the Zn/O ratio.

Table 1 lists the AES-measured N concentration in ZnO films formed with different gas-source combinations.

TABLE 1

N Concentration of ZnO films measured by AES.
All films deposited at a substrate temperature of 400° C.

| ID | O$_2$ flow rate (sccm) | NO flow rate (sccm) | Zn/O ratio | N concentration In ZnO film (%) |
|---|---|---|---|---|
| ZnOA97 | 100 | 10 | 0.00476 | 0 |
| ZnOB18 | 1 | 20 | 0.01818 | 1.75 |
| ZnOA106 | 0 | 20 | 0.02500 | 2.96 |
| ZnOA113 | 0 | 40 | 0.01042 | 1.92 |

Structural Analysis

Figure 1:
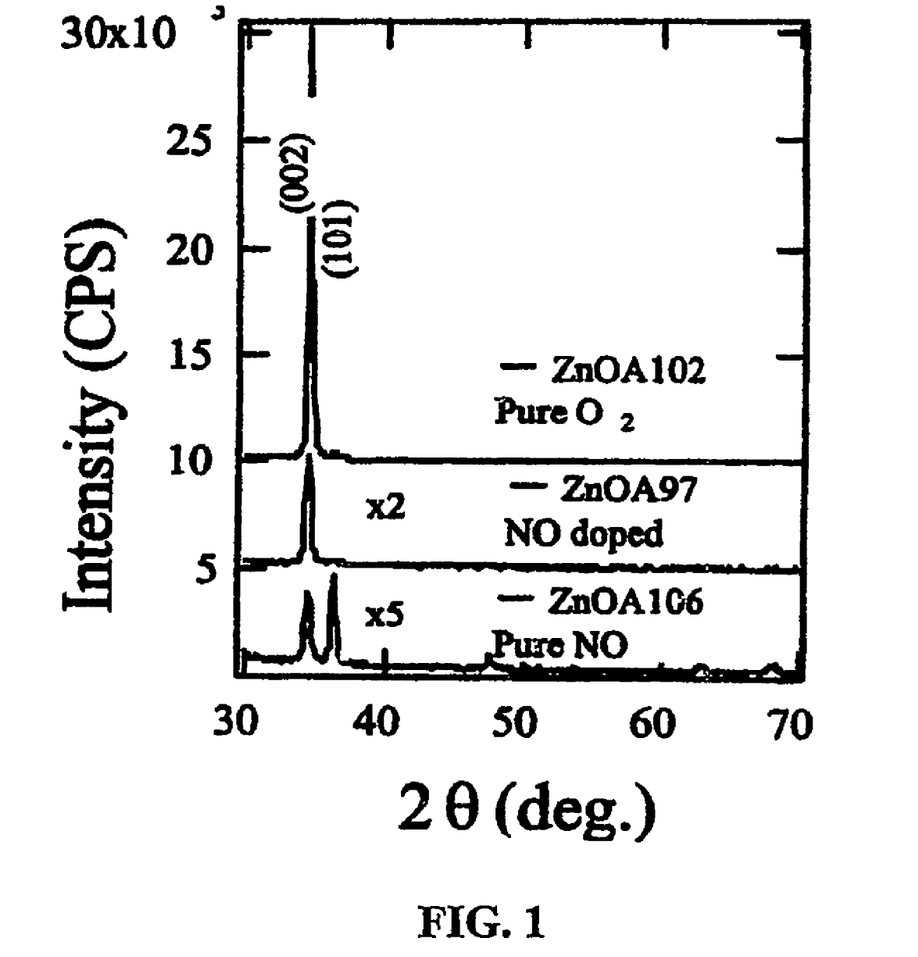
FIG. 1 is an x-ray diffractogram that provides indications of structural properties of the film formed under different precursor combinations.

XRD analysis of the undoped ZnO film reveals a hexagonal (wurtzite) crystal structure. At deposition temperatures higher than 300° C., these undoped films demonstrate strong preferential orientation in the (0002) direction. When NO gas is added, the crystallinity of the film decreases and the (0002) preferred orientation is reduced. FIG. 1 shows the XRD spectra of the ZnO formed at 400° C. with (a) DEZ+O$_2$, (b) DEZ+O$_2$+NO, and (c) DEZ+NO. For the (a) films, the ZnO film is highly c-axis orientated, the (0002) peak width at half maximum (FWHM) is narrow. For the (b) films, the c-axis orientation is reduced while for (c) films, the intensity of all the XRD peaks is reduced and films are less oriented. The FWHM of the (0002) peak increases with nitrogen concentration such that for (a) films =0.1521°, for (b) films =0.2803°, and for (c) films =0.3604°. The increase in the FWHW parameter indicates that NO addition into the reactant source results in poor crystallinity or non-uniform stress in ZnO:N.

The XRD did not detect any zinc nitride peaks for all the ZnO films studied, even those made reacting DEZ and NO. Considering that NO provides equal amounts of nitrogen and oxygen, this suggest that NO is unstable in the CVD reaction chamber and although NO may dissociate during deposition, it can quickly form $N_2$ and $O_2$ molecules. Because $N_2$ is more stable than $O_2$ at the reaction temperature, the majority of the $N_2$ will not react, while the $O_2$ will react with DEZ to form ZnO film.

Electrical Properties

The electrical properties of ZnO films were studied as a function of reactant sources, Zn to O ratio, and substrate temperature. For undoped films produced by reaction of DEZ and $O_2$, the films are either highly resistive or lightly n-Type. The carrier concentration is $\sim 10^{17}$ cm$^{-3}$ for the growth temperature range of 300° C. to 500° C., and the Hall mobility is $\sim 10$ cm$^2$V$^{-1}$s$^{-1}$. When a small amount of NO gas is added to the chamber, the ZnO films continue to demonstrate n-Type behavior. The carrier concentration of these films is similar to undoped ZnO, but Hall mobility is about one order of magnitude lower ($\sim 1$ cm$^2$V$^{-1}$S$^{-1}$). Considering the reduction in crystal quality observed by XRD when NO is added to the other gas sources, and considering the detection limits of the AES, we believe N may be incorporated into these films at concentrations <0.5 at. % in such a way that it is electrically inactive. In this case, neutral impurity scattered by N would produce the observed decrease in Hall mobility.

For CVD reaction of DEZ with only NO, the NO gas serves as both oxidizer and dopant.

Figure 6:
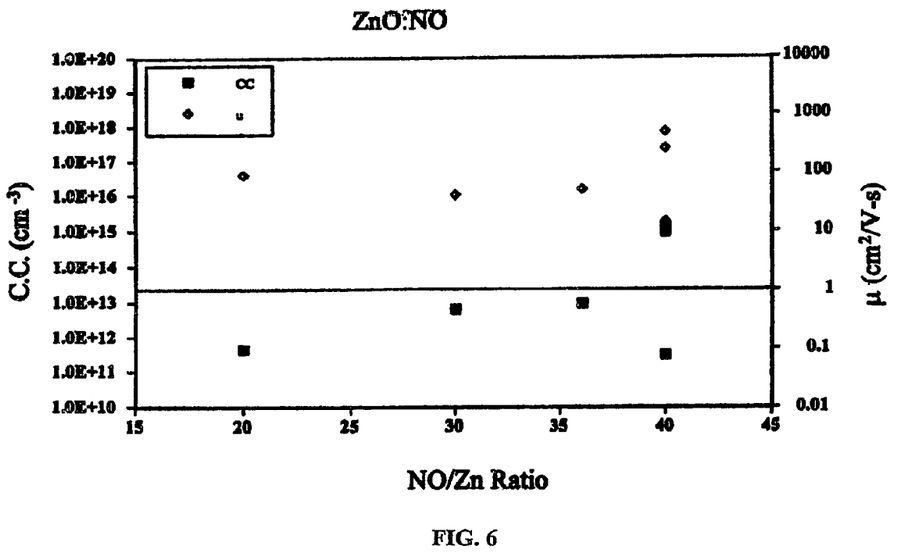
FIG. 6 is a graph depicting the electrical properties versus NO/Zn ratio for ZnO:NO films.

In this case, XRD analysis indicates the film remains a ZnO structure while composition analysis indicates that the N concentration is generally over 2 at. %. Under these conditions, p-Type behavior is observed for ZnO films deposited at substrate temperatures between 400-450° C. The p-Type ZnO films were formed and the hole concentration reached $10^{15}$ cm$^{-3}$ at NO to Zn ratio close to 40, as can be seen in FIG. 6. The conditions for FIG. 6 are: $F_{O2}=0 F_{NO}$ is varied; $F_{DEZ}=0.5$ and 1 sccm; and $T_d=400°$ C.

Figure 7:
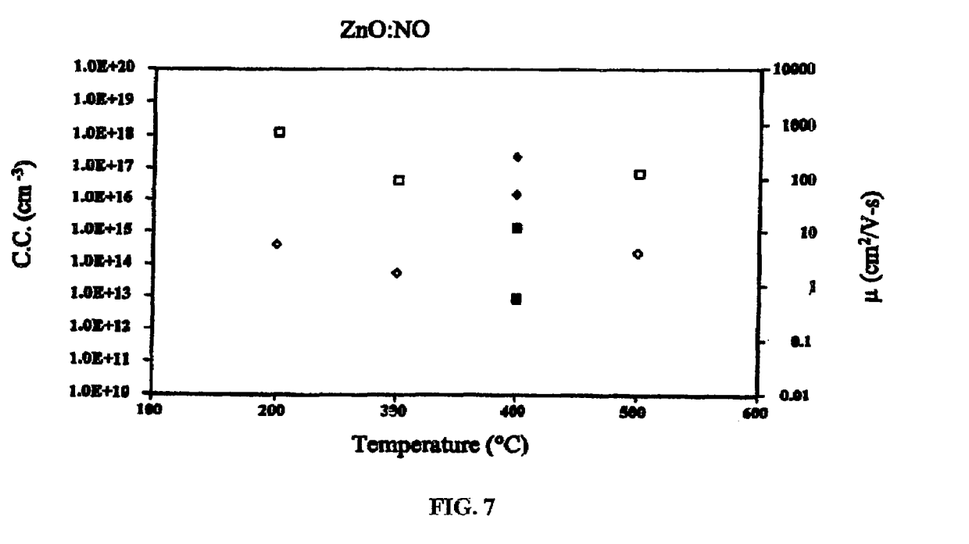
FIG. 7 is a graph depicting electrical properties versus deposition temperature for p-Type ZnO:N films.

The p-Type ZnO:N films are formed only around a deposition temperature of about 400° C., as may be seen in FIG. 7. The solid dots are p-Type and the open dots in the graph are n-Type. The conditions for FIG. 7 are as follows: $T_d$ is varied; $F_{NO}=20$ sccm; and $F_{DEZ}=0.5$ and 1 sccm. One film deposited at a temperature of 400° C. demonstrated p-Type carrier concentration of $1.4 \times 10^{15}$ cm$^{-3}$ and an extraordinary high Hall mobility of 260 cm$^2$V$^{-1}$s$^{-1}$. Attempts to increase further the N connection in these ZnO:N films by increasing NO concentration in the chamber were unsuccessful. As indicated previously, increasing the NO flow rate decreases ZN-to-O ratio, decreases the N concentration, and produces n-Type films. This suggests that when the NO flow rate increases in the reaction chamber, more oxygen becomes available in the system and the ZnO film surface switches to an O-rich growth stoichiometry. As a result, the formation of energy for $N_O$ defect increased and less nitrogen is incorporated into the ZnO film.

These results further indicate that only when the N concentration in the film is higher than 2% can hole concentration overcome the electron concentration and produce p-Type conduction. Lower N concentration in the ZnO film does not produce enough holes to compensate for the native donors, and the ZnO film remains n-Type. Attempts to increase the (uncompensated) acceptor level by decreasing the oxygen-vacancy related (donor) defects by increasing O also produced n-Type films, because of the same Zn-to-O ratio observations stated above.

The effect of substrate temperature on the electrical properties was also studied. For films deposited in ambients of DEZ+$O_2$+NO, p-Type behavior was not observed in the temperature range of 200-500° C. For films deposited in ambients of DEZ+NO, p-Type behavior was only observed at substrate temperatures of 400° C., 420° C. and 440° C. The variation of the film electrical properties with substrate temperature is listed in Table 2. Additional confirmation of p-Type conduction in these ZnO:N films is provided by Seebeck coefficient measurements. Although a positive Seebeck coefficient was observed (indicating p-Type behavior), a positive offset of the Seebeck voltage at zero temperature gradient was also observed.

TABLE 2

Electrical Properties of ZnO film deposited with a pure NO gas and at different temperatures

| ID | Growth Temperature (° C.) | Carrier Type | C.C. (cm$^{-3}$) | μ (cm$^2$V$^{-1}$s$^{-1}$) | R (Ω-cm) |
|---|---|---|---|---|---|
| ZnOB8 | 300 | n | 4.40e16 | 1.66 | 85.4 |
| ZnOA106 | 400 | p | 1.40e15 | 260 | 17.5 |
| ZnOB12 | 420 | p | 6.35e17 | 0.24 | 41.0 |
| ZnOB13 | 440 | p | 1.06e18 | 0.34 | 17.3 |
| ZnOB6 | 500 | n | 7.37e16 | 4.1 | 52.4 |

Optical Properties

Figure 2:
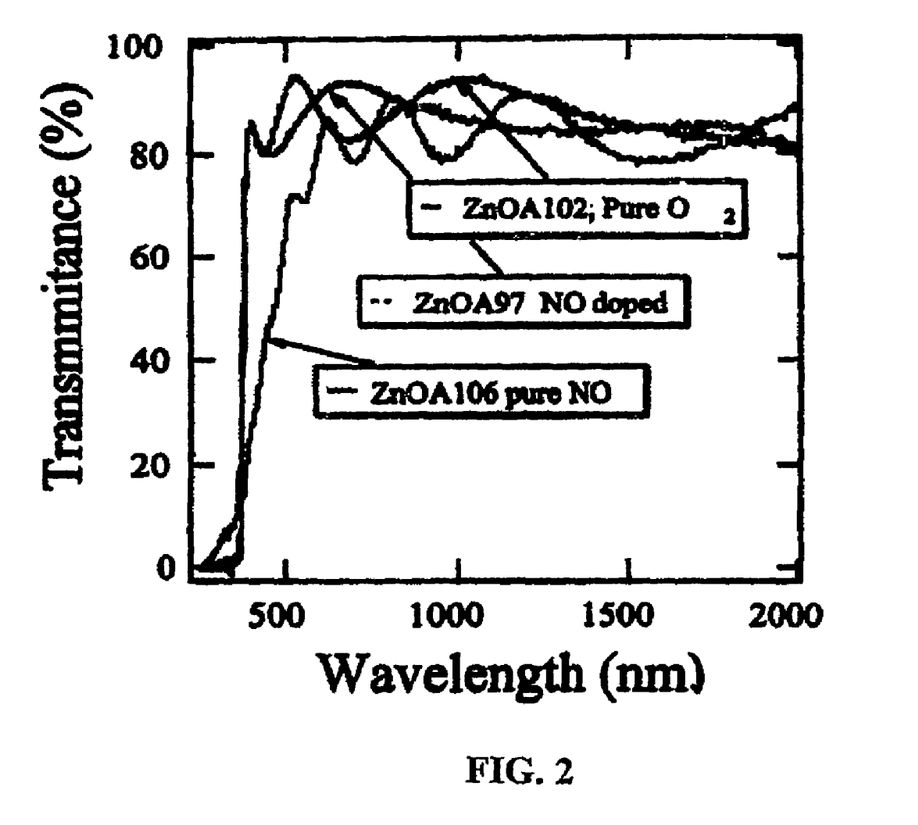
FIG. 2 is a graph showing optical transmission spectra of ZnO films that are present in FIG. 1.

FIG. 2 shows optical transmission spectra for ZnO films made using DEZ+$O_2$ (n-Type), DEZ+$O_2$+NO (n-Type), and DEZ+NO (p-Type). The transmission of all three films is ~90% across most of the visible wavelength range, however, significant difference is observed at the fundamental adsorption edge. Here, the ZnO formed using DEZ+$O_2$ and DEZ+$O_2$+NO reveal a very sharp absorption edge. By contrast, the p-Type ZnO formed using DEZ+NO has a much softer absorption edge, and suggest that sub-bandgap levels have formed due to nitrogen doping.

Referring back to FIG. 1 where structure properties may be seen, it is clear from FIG. 2 that the NO introduces intra-bandgap defect levels into the ZnO film. These defect levels are not present in $O_2$ and $O_2$/NO formed films.

With regard to FIG. 1, insofar as optical and structural properties are concerned, it is clear that, compared with un-doped ZnO films, the nitrogen-doped ZnO films have weak x-ray defraction (XRD) peaks and more random orientation.

The growth of p-Type ZnO films have been studied by reacting DEZ with $O_2$ and/or NO using low pressure metalorganic chemical vapor deposition (LPMOCVD). The results indicate that the use of NO allows atomic N to be incorporated into ZnO films without use of high-temperature or plasma-process steps. The highest N concentrations of ~3 at. % occur in films grown with DEZ+NO (i.e., no ($O_2$ source)). Only those ZnO film with nitrogen concentration over 2% demonstrate p-Type behavior. Further, it is observed that high N concentration and p-Type behavior occurs only when there is a high Zn-to-O ratio in the reactant ambient. Although electrical properties of these p-Type ZnO:N are comparable with other N-doped doping processes, N doping with NO produces lower carrier concentration but higher mobility. These are the conditions appropriate for producing p-ZnO:N films.

It will be clear that the Invention is well adapted to attain the ends and advantages mentioned as well as those inherent therein. While a presently preferred embodiment has been described for purposes of this disclosure, various changes and modifications may be made which are well within the scope of the invention. Numerous other changes may be made which will readily suggest themselves to those skilled in the art and which are encompassed in the spirit of the invention disclosed herein and as defined in the appended claims. The entire disclosure and all publications cited herein are hereby incorporated by reference.

The invention claimed is:

1. A process of using chemical vapor deposition for producing transparent p-type conducting oxide films without co-doping, plasma enhancement or the use of high temperature, comprising:
 (a) introducing a dialkyl metal at ambient temperature in a carrier gas into a low pressure deposition chamber, and
 (b) introducing NO alone or with an oxidizer into said chamber under an environment sufficient to produce a metal-rich condition to enable NO decomposition and atomic nitrogen incorporation into the formed transparent metal conducting oxide at over about 2 atomic %;
 said dialkyl is selected from the group consisting of dimethyl and diethyl.

2. The process of claim 1 wherein said metal is selected from the group consisting of Zn, Cd, in, Sn, Ga and alloys thereof.

3. The process of claim 2 wherein said transparent conducting oxide is selected from the group consisting of ZnO, CdO, $In_2O_3$, $SnO_2$, $Ga_2O_3$ and alloys thereof.

4. The process of claim 3 wherein said carrier gas is selected from the group consisting of $N_2$ or Ar.

5. The process of claim 4 wherein in step b) NO is introduced alone.

6. The process of claim 5 wherein NO is introduced with an oxidizer.

7. The process of claim 6 wherein said oxidizer is $O_2$.

8. The process of claim 6 wherein said ambient temperature is about 23° C.+/−2° C.

9. The process of claim 7 wherein said ambient temperature is about 23° C.+/−2° C.

10. The process of claim 8 wherein said chamber pressure is about 30 torr.

11. The process of claim 9 wherein said chamber pressure is about 30 torr.

12. The process of claim 10 wherein total gas flow through said chamber during deposition is between about 2,000 to about 3,000 sccm.

13. The process of claim 11 wherein total gas flow through said chamber during deposition is between about 2,000 to about 3,000 sccm.

14. The process of claim 12 wherein said deposition temperature is between about 200 to about 550° C.

15. The process of claim 13 wherein said deposition temperature is between about 200 to about 550° C.

16. A p-type transparent conducting oxide film consisting essentially of a transparent conducting oxide formed from a dialkyl metal and a NO doping source, said oxide and said NO doping source being grown without co-doping, plasma enhancement or high temperature and under an environment sufficient to produce a metal rich condition to enable NO decomposition and atomic nitrogen incorporation into formed transparent metal conducting oxide at over about 2 atomic %.

17. The film of claim 16 wherein said dialkyl is selected from the group consisting of dimethyl and diethyl and said metal is selected from the group consisting of Zn, Cd, In, Sn, Ga and alloys thereof.

18. The film of claim 17 wherein said transparent conducting oxide is selected from the group consisting of ZnO, CdO, $In_2O_3$, $SnO_2$, $Ga_2O_3$ and alloys hereof.

19. The film of claim 18 wherein said transparent conducting oxide is ZnO.

* * * * *